United States Patent
Laurent-Michel (10) Patent No.: US 8,548,037 B1
(45) Date of Patent: Oct. 1, 2013

(54) METHOD AND IMPLEMENTATION FOR EFFICIENTLY ADAPTING CHANNEL FILTER CHARACTERISTICS

(75) Inventor: Stéphane Laurent-Michel, Longmont, CO (US)

(73) Assignee: CSR Technology Inc., San Jose, CA (US)

( * ) Notice: Subject to any disclaimer, the term of this patent is extended or adjusted under 35 U.S.C. 154(b) by 363 days.

(21) Appl. No.: 12/895,501

(22) Filed: Sep. 30, 2010

(51) Int. Cl.
 *H03H 7/30* (2006.01)
(52) U.S. Cl.
 USPC ........... 375/232; 340/290; 348/538; 381/94.4
(58) Field of Classification Search
 None
 See application file for complete search history.

(56) References Cited

U.S. PATENT DOCUMENTS

| | | | |
|---|---|---|---|
| 2001/0024475 A1* | 9/2001 | Kumar | 375/270 |
| 2008/0085693 A1* | 4/2008 | Harms | 455/255 |

* cited by examiner

*Primary Examiner* — Adolf Dsouza
(74) *Attorney, Agent, or Firm* — Fulbright & Jaworski LLP (57) ABSTRACT

Automatic recalculation of tuner filter coefficients are made in order to compensate for changes in signal properties due to processing functionality in the tuner. The architecture compensates for processing changes, such as a large continuous range of clock frequency shifts, while not sacrificing bandwidth response characteristics of the channel filter. Embodiments may calculate coefficients in order to obtain response characteristics while utilizing a completely on-chip architecture, which does not require accessing off-chip software driver programs, and does not require complex look-up tables containing filter coefficients stored in onboard memory.

19 Claims, 7 Drawing Sheets

METHOD AND IMPLEMENTATION FOR EFFICIENTLY ADAPTING CHANNEL FILTER CHARACTERISTICS

TECHNICAL FIELD

The present disclosure relates to tuner devices. More specifically, the present disclosure relates to dynamic improvements to channel filtering on such tuner devices.

BACKGROUND

In tuner design, various steps have been undertaken in order to compensate for or eliminate spurious signals associated with sampling clock frequencies and/or frequencies of one or more local oscillators of the tuner circuit. Included in these compensation steps are measures directed to shifting the sampling frequencies utilized in a tuner circuit in a manner to cause such spurious signals to fall outside of the output band of interest for a particular channel being tuned. However, these measures may create adverse effects on subsequent signal processing functions of the tuner.

For example, in tuners which integrate channel filtering functionality into the tuner circuit, filters, such as a Finite Impulse Response ("FIR") filter, are utilized. These filters generally come with a pre-defined set of filter coefficients which are configured to exhibit frequency response characteristics corresponding to a desired configuration of the filter. However, spur avoidance algorithms which shift the sampling clock and/or other digital clocks to remove a spur from the desired output band cause the coefficient set of a particular FIR filter to exhibit an unwanted frequency response in response to the shifted sampling frequency.

One method to compensate for the above phenomenon is to embed multiple filters onto a ROM located on the tuner chip and configure the ROM to provide different selected filter coefficients depending on the sampling or clock frequency utilized by the tuner. This method however, is only acceptable when there are a small amount of possible sample frequency variations. For example, in tuner circuits where spur avoidance methods utilize a much larger or even contiguous frequency range of sampling frequencies, utilizing multiple filters embedded on a ROM becomes unduly burdensome due to the number of differing coefficient sets which must be stored.

Another method to compensate filter coefficients for shifting sampling frequencies could be to implement an off-chip software recalculation using the respective driver software. A method such as this would be disfavored due to its many limitations. For example, if a system were to implement this type solution, it could only perform within a limited number of sampling frequency changes because the speed of the recalculation and subsequent reconfiguration of the filter on the tuner chip would be too slow to meet consumer demands. This problem would be further exacerbated when compensating for large ranges of sampling frequencies.

Another method would be to resample the signal to match the frequency at which the filter was designed. This method to avoid the re-computation of the filter coefficients ends up creating a new spur at a frequency multiple of the resample rate. The spur energy is created by information in the signal itself revamped at the resample frequency. This creates a second set of spur frequencies to avoid. Using a single sampling rate, we can focus the spur avoidance to a single set of spurs to avoid.

SUMMARY

The present application provides for methods, systems, and devices which provide an automatic, on-chip, recalculation of filter coefficients on a tuner in order to compensate for changes in signal properties due to processing functionality of the tuner. Coefficient calculations may be implemented by utilizing a reference value stored in memory on the tuner chip and an interpolation module configured to interpolate new filter characteristics which are proportional to changes in signal processing properties of a tuner.

In some embodiments, new coefficients may be calculated in response to changes in clocking signal properties, such as a change in a the sampling rate, a change in the clock signal provided to digital systems, and the like. These changes may be a result of spurious signal avoidance methods or algorithms which attempt to shift spurious signals outside of an output band of interest for a particular channel being tuned. Accordingly, in some embodiments, a new frequency response of a channel filter may be obtained by interpolating proportional changes in clocking signal properties with a reference response value.

Utilizing the architecture described herein, embodiments of the present invention are able to automatically compensate many processing property changes, such as for a large continuous range of clock frequency shifts, while not sacrificing bandwidth response characteristics of the channel filter. Further, the present solutions are able to calculate coefficients in order to accomplish improved response characteristics while utilizing a completely on-chip architecture, which does not require accessing off-chip software driver programs, or require complex look-up tables containing filter coefficients stored in onboard memory.

In one embodiment, a digital processing module is configured to produce a channel filtered output. The digital processing module may include a coefficient calculating module configured to automatically calculate and produce updated filter coefficients for a channel filter in response to changes in processing characteristics of a broadband tuner. These calculations of new or updated filter coefficients may be implemented completely on the broadband tuner chip.

Another embodiment may include a filter device on an integrated circuit which is configured to receive an input signal and filter the input signal utilizing filter coefficients corresponding to existing processing characteristics of the integrated circuit. In this embodiment, a filter coefficient calculating device may also be included on the integrated circuit. The filter coefficient calculating device may be configured to automatically calculate new filter coefficients in response to a change in the existing processing characteristics. These new filter coefficients are then provided to the filter device in order to generate a filtered output signal.

Further, a method for automatically compensating for changes in frequency response characteristics of a channel filter on a tuner chip is described. The method may include monitoring processing functions on the tuner chip for changes in signal processing properties. If changes are detected, information corresponding to these changes may be provided to a filter coefficient compensation device. The filter coefficient compensation device may function to compare the monitored changes to reference one or more values which correspond to pre-defined processing characteristics. Further, the differences between said monitored changes and said reference values may be interpolated in order to produce adjusted filter coefficients which are configured to substantially maintain the pre-determined frequency response capabilities of the channel filter.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
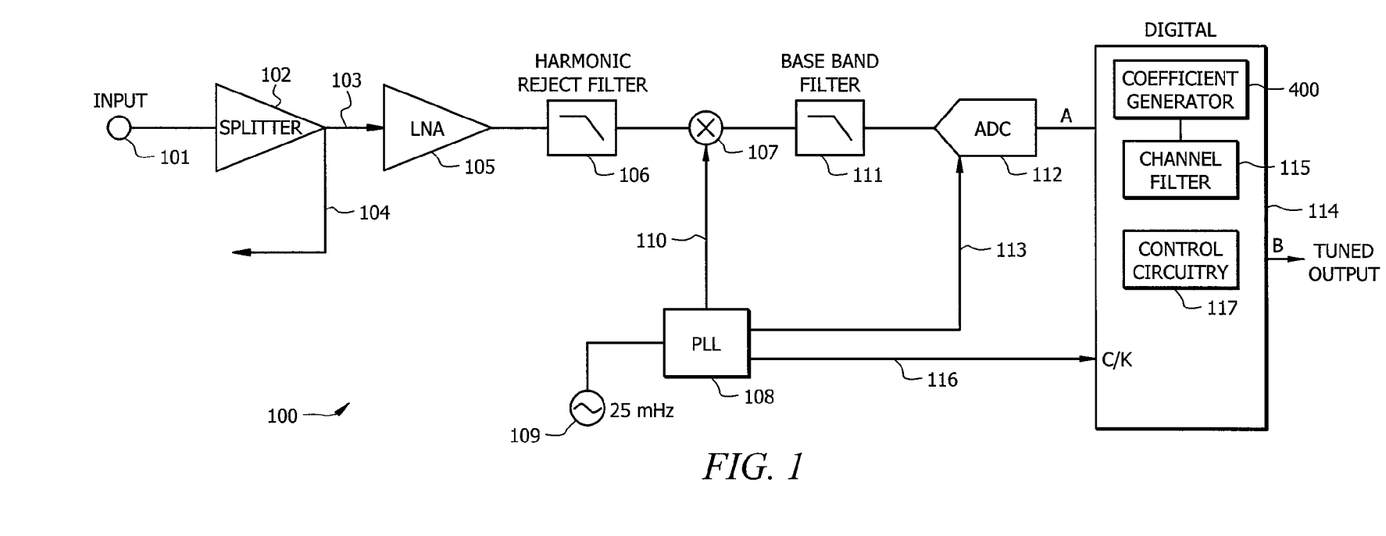
FIG. 1 is a block diagram of an overall tuner system in accordance with an embodiment of the present invention.

FIG. 1 illustrates a block diagram of an overall tuner 100 system in accordance with an embodiment of the present invention. In this embodiment, tuner 100 is a direct conversion tuner which includes coefficient generator 400 (FIG. 4) to compensate for changes in processing characteristics within tuner 100 which occur when tuning different channels. Tuner 100 is configured to receive an input signal 101, generally in the range of 50 MHz to 1 GHz, and is configured to tune to a channel signal within that frequency range. The input signal feeds into splitter 102. Splitter 102 may be embodied as a simple amplifier having multiple output signals 103 and 104. In some embodiments, output signal 104 may be sent to a second tuner, or to different processing circuitry. The main output signal 103 feeds into a low noise amplifier (LNA) 105 to amplify the signal for further processing, and is then fed into harmonic reject filter 106. Harmonic reject filter 106 may be any filter which functions to reject harmonics of the broadband signal received at input 101. In some embodiments, harmonic reject filter 106 may be implemented as a low pass filter.

The filtered signal then passes through mixer 107 which also contains harmonic rejection properties. Phase-locked loop (PLL) 108 is coupled to oscillator 109 and provides one or more clock frequencies to various blocks of tuner 100. One such clock signal 110 is used as a mixing signal, and is provided to mixer 107 and is mixed with the output signal from harmonic reject filter 106. Mixing signal 110 may also be a source of harmonic or spurious signals occurring in the output band of interest. As such, tuner 100 may contain processing control circuitry 117 which is configured to cause changes in mixing signal 110 to compensate for such spurious signals in order to shift any spurs outside at the output band of interest.

Embodiments may split the mixed signal into an in-phase path, I, and quadrature path, Q, for further processing, and each path may propagate separately through the next functional blocks of filter 100. The mixed signal is then fed into baseband filter 111, and then to analog-to-digital converter (ADC) 112. ADC 112 receives clock signal 113 (in this case used as a sampling signal) from PLL 108. Sampling signal 113 may also cause undesired effects in the output band of interest. ADC 112 utilizes sampling signal 113 to convert the input signal from baseband filter 111 to a digital signal which is then input into digital block 114.

Digital block 114 may include control circuitry 117 which controls various functions within digital block 114 and may be utilized to control PLL 108 when shifting clocking signal frequencies. While digital block 114 is responsible for a significant amount of processing, such as equalization and noise compensation which will not be described herein, one of the main functions of digital block 114 is to implement channel filtering at channel filter block 115. Channel filter block 115 may be embodied as a low-pass, finite impulse response (FIR) filter. Further, channel filter block 115 may be embodied as a 64-tap complex low-pass filter. Digital block 114 will generally have one clock signal 116 that feeds each of the digital circuits within digital block 114 with a single clock frequency. The frequency of clock signal 116 will preferably be a multiple of sampling signal 113.

As a result of the amount of circuitry within digital block 114 which potentially clocks at clock signal 116 frequency, spurs may be created with a significant amount of energy at the frequency of clock signal 116 and its corresponding harmonics. This phenomenon potentially causes problems when implementing accurate channel filtering at filter block 115. Because of this, it may be advantageous to change the frequency of clock signal 116 depending on the particular frequency or channel the circuit is attempting to tune at any given time. However, when the frequency of clock signal 116 is changed, it changes the shape of the filter response of channel filter 115. Accordingly, embodiments of the present invention allow coefficient generator 400 to adjust the coefficients utilized by channel filter 115 in order to attain an acceptable frequency response shape in response to changes in various characteristics of tuner 100, such as changing frequency of the clock signal 116, sampling signal 113 or mixing signal 110. Detailed embodiments of coefficient generator 400 will be described in more detail below with respect to the discussion of FIG. 4.

Figure 4:
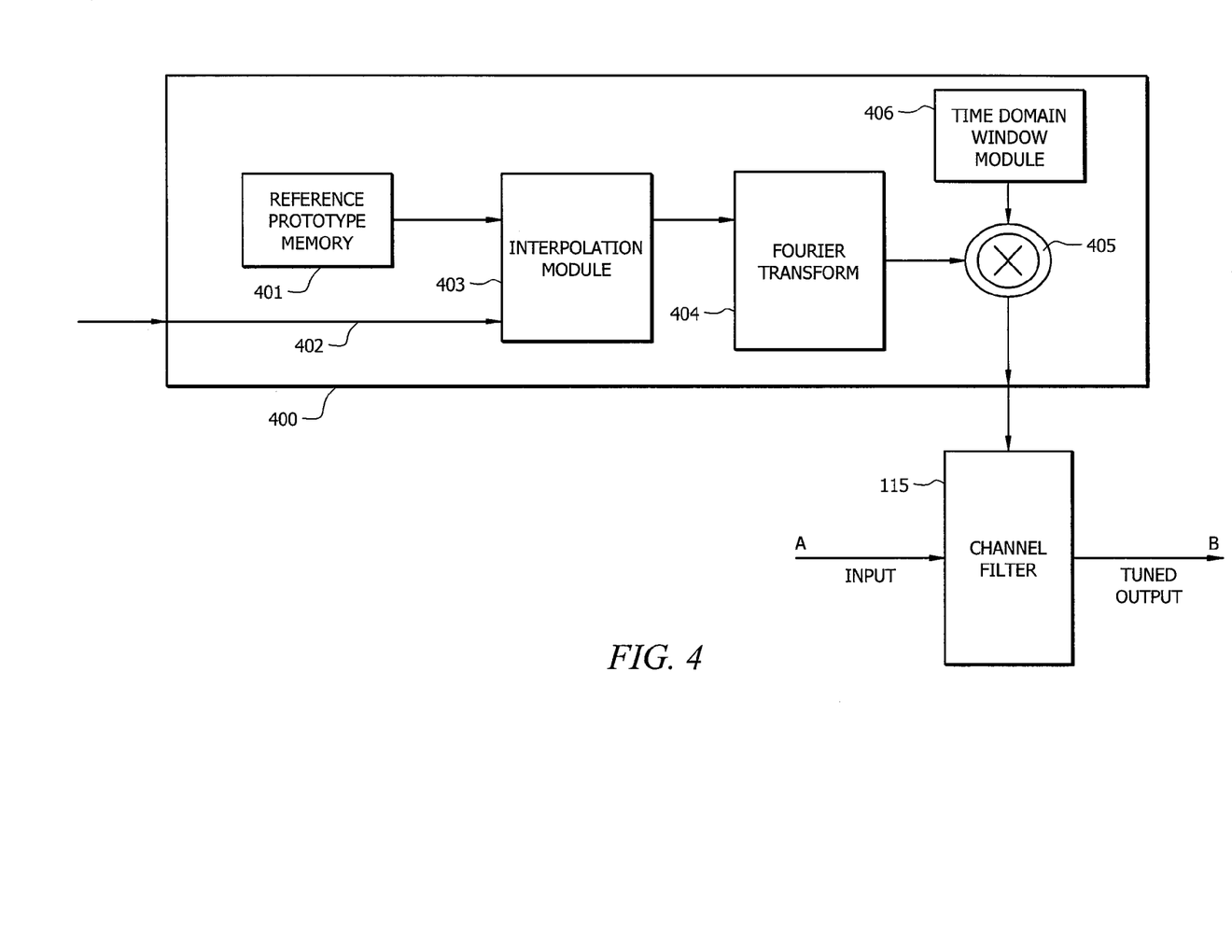
FIG. 4 illustrates a coefficient generator in accordance with an embodiment of the present invention.

Other embodiments may utilize multiple PLLs for spur avoidance and may have to compensate for spurious signals generated by signals which propagate from each PLL. In these instances, coefficient generator 400 may still be configured to adjust the frequency response of channel filter 115 to provide more accurate tuning in tuner 100. Further, coefficient generator 400 may be configured to compensate for other changes due to various processing blocks in tuner 100, which adversely affects channel filter 115.

Figure 2:
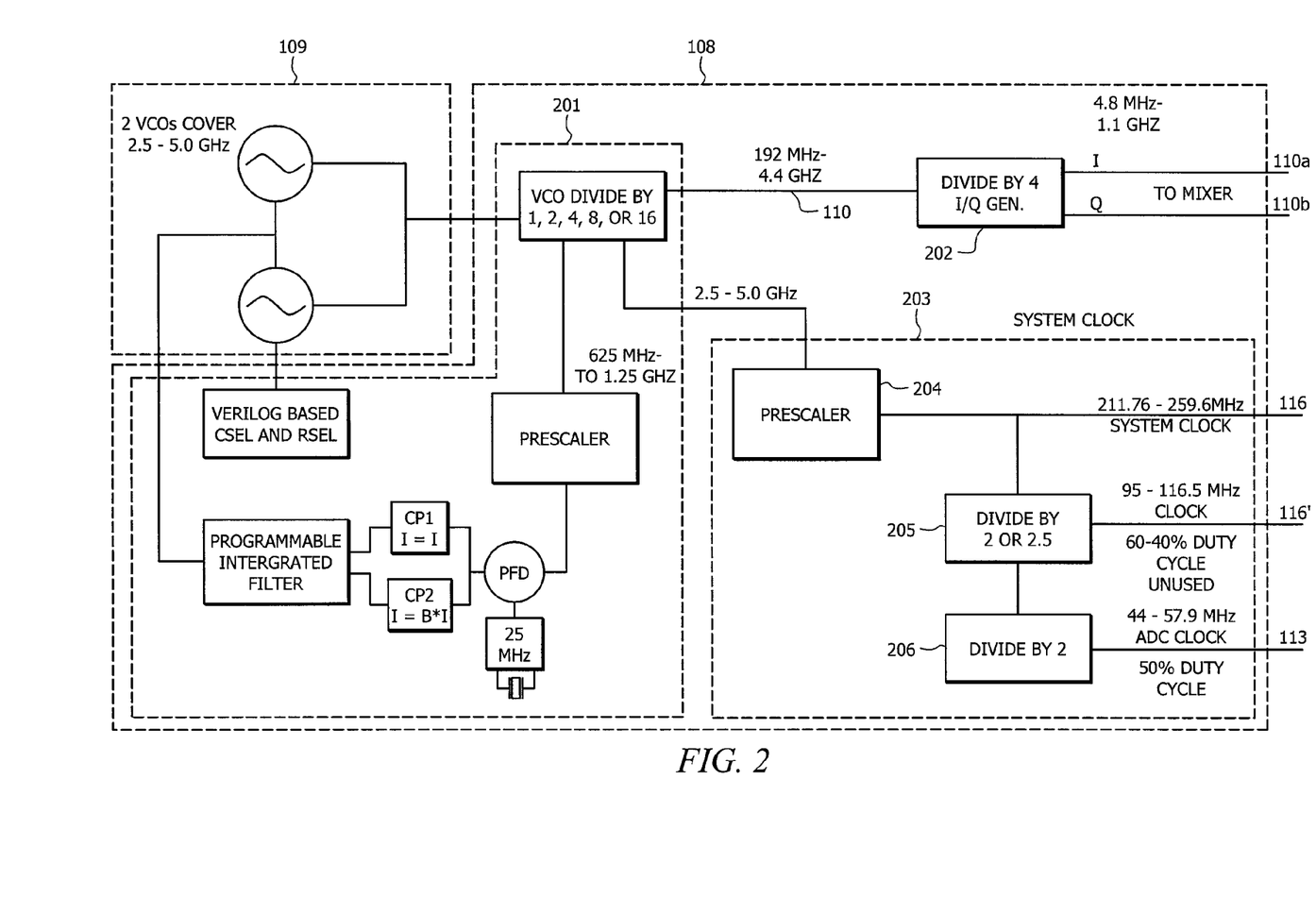
FIG. 2 illustrates an example implementation of a clocking signal generating device in accordance with an embodiment of the present invention.

FIG. 2 illustrates an example implementation of oscillator 109 (FIG. 1) and PLL 108 (FIG. 1) which in conjunction are configured to provide the various signals described herein. In order to yield a wider range of potential clock signals, multiple oscillators 109 may be utilized. The oscillator signals from oscillators 109 are filtered, scaled, and divided in conditioning circuitry 201 in accordance with an algorithm which functions to shift any spurious signals which may result, at least in part, from signals generated by PLL 108. After such conditioning, signal 110 may be provided to mixer 107. Further, as discussed above, the signal path of tuner 100 may be split into an in-phase path, I, and a quadrature path, Q. In these embodiments, PLL 108 may include divider 202 to create in-phase mixing signal 110a and quadrature mixing signal 110b. System clock generator block 203 may include scaler 204 configured to further scale the condition signals and generate clock signal 116. In some circumstances, clock signal and 116 may be further divided at divider 205 to yield clock signal 116'. Additionally, as stated above, sampling signal 113 will generally be a factor of clock signal 116. Accordingly, signal clock generator block 202 may further include divider 206 to generate sampling signal 113.

Figure 3:
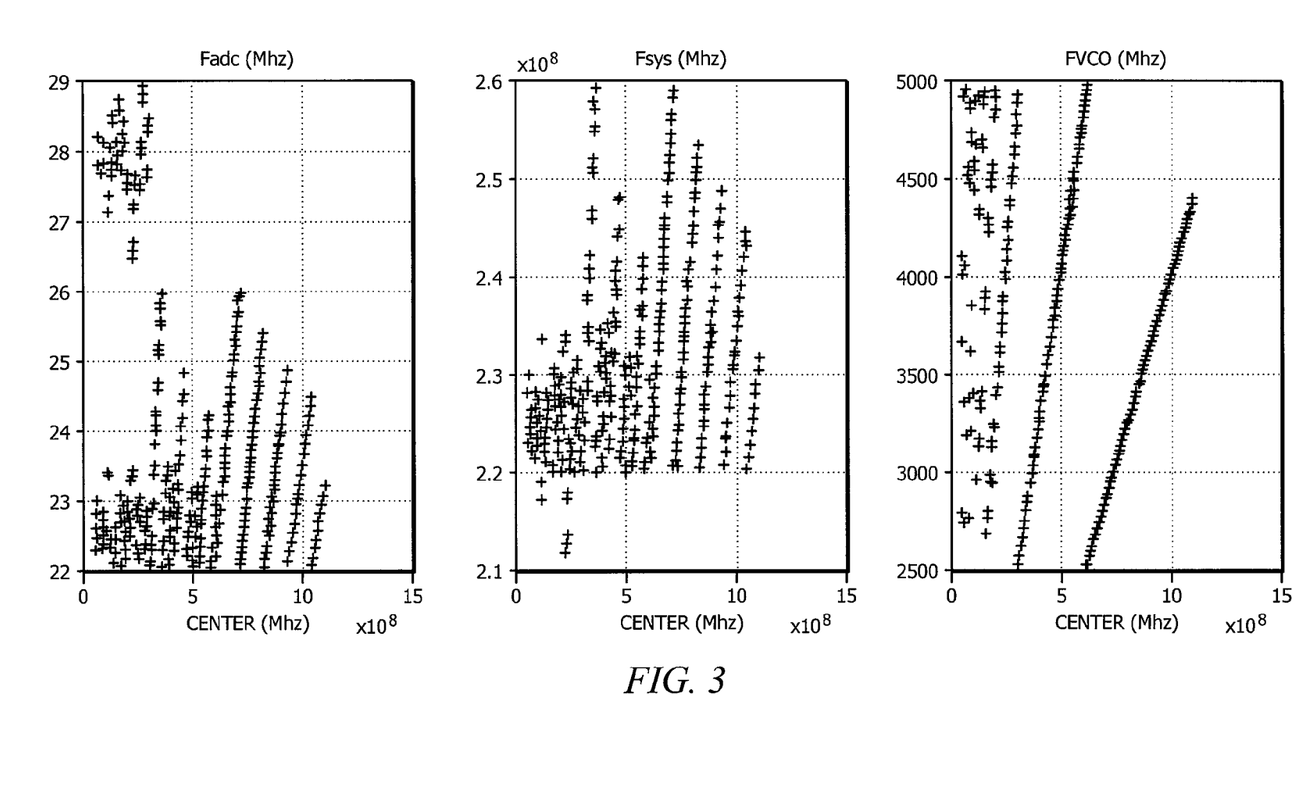
FIG. 3 shows frequency response plots which illustrate the effects of shifting various signal clock rates provided by the clocking signal generating device of FIG. 2.

FIG. 3 shows frequency response plots which illustrate the effects of shifting various signal clock rates provided by PLL 108. These plots represent the selected digital frequencies (sampling and asic system clock) along with the PLL VCO frequency, each "+" is a channel (marked at it's center frequency). The Y axis illustrates the sampling/asic clock and VCO frequency for each channel as a result of the spur avoidance calculations. As can be seen, changes in sampling frequency and clock frequencies in order to implement spur avoidance yield nearly a 30-35% change in output frequency response. Accordingly, if characteristics of channel filter 115 were to remain unchanged, such changes in frequencies generated by PLL 108 materially affect the overall accuracy of tuner 100.

FIG. 4 illustrates a coefficient generator 400 in accordance with an embodiment of the present invention. Coefficient generator 400 includes reference prototype memory 401 which contains a frequency domain reference curve containing one or more reference values corresponding to a filter prototype. The frequency domain reference curve represents an ideal value frequency response for channel filter 115 which corresponds to a pre-determined reference clock frequency. In some embodiments, the reference curve embedded in reference prototype memory 401 may include a 64 point frequency domain reference curve.

Coefficient generator 400 is configured to accept a clock signal input 402 which is representative of a sampling frequency or clock frequency which has been shifted with respect to the reference frequency. In some embodiments, a ratio of the clock signal input 402 versus the reference frequency of the frequency domain reference curve is calculated within coefficient generator 400, while other embodiments may receive clock signal input 402 that is already representative of the ratio of the actual signal versus the reference frequency.

With the clock signal ratio, the frequency domain reference curve may be scaled according to the clock ratio. In some embodiments, this scaling is implemented using interpolation module 403 which performs a background interpolation. Interpolation module 403 may further be configured to utilize a piecewise parabolic interpolation method.

After scaling has been completed in the frequency domain, the scaled signal is input into Fourier transform module 404 to transform the scaled signal into a time domain representation. In some embodiments, to transform from the frequency domain to the time domain may include implementing a discrete Fourier transform (DFT) which utilizes a 128 point grid in the complex domain. In such embodiments, the piecewise parabolic interpolation creates a 64 point scale frequency response that functions to take the major bit and adjust the phase. With this response, the DFT is performed in transform module 404 to return to the real domain and obtain the adjusted real filter coefficients for performing channel filtering in a complex channel filter.

In some embodiments, it may be preferable to improve the adjusted filter coefficients obtained from transform module 404. Accordingly, the coefficients may be convolved 405 with a function provided by time domain window module 406. Any appropriate window will improve the adjusted coefficients. In some embodiments, a standard hamming window is utilized. Such a hamming window may be a 64 point hamming window yielding 64 coefficients which are then automatically loaded into the channel filter 115. Using the new coefficients, channel filter 115 may then process the signal while keeping the bandwidth constant and achieving the desired performance requirements from the system, while also compensating for spurious signals injected within the tuner circuit.

Figure 5A:
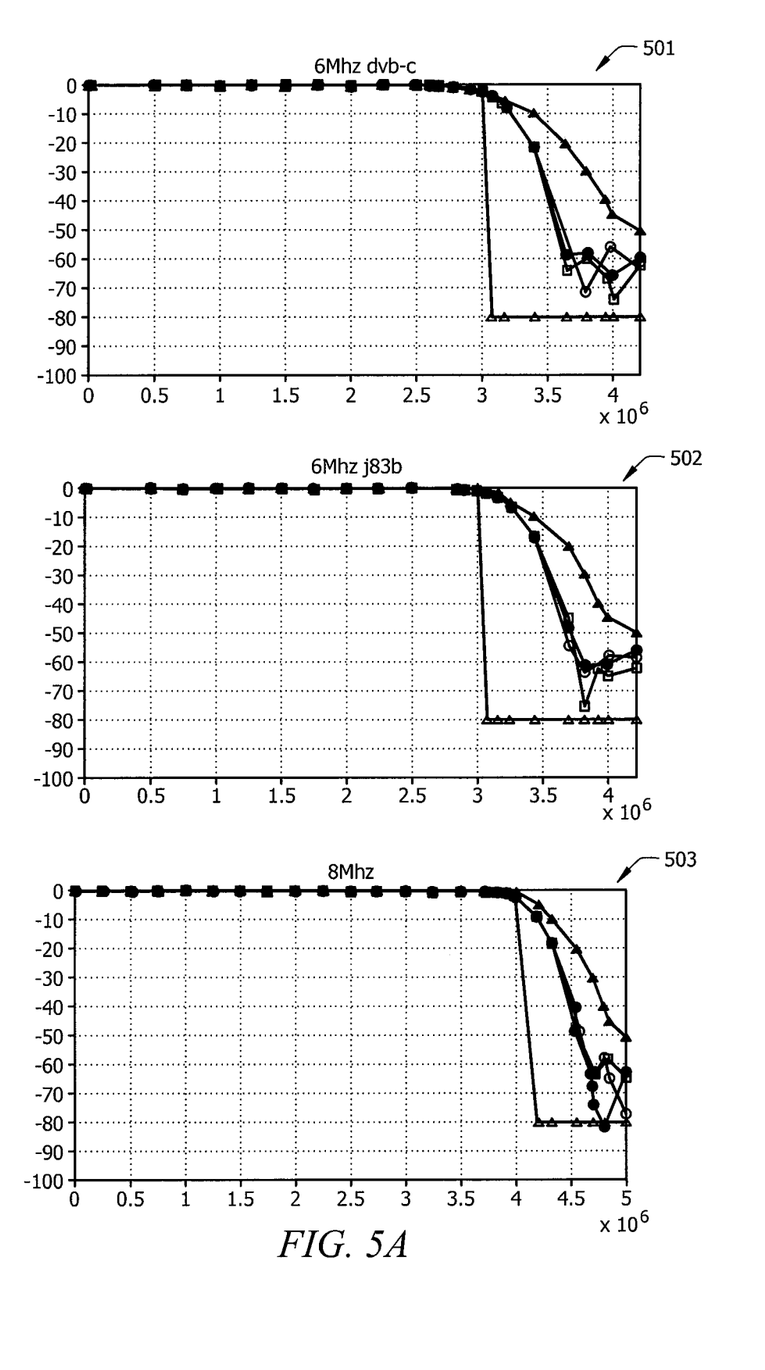
FIG. 5 illustrates example filter response plots in accordance with embodiments of the present invention.
Figure 5B:
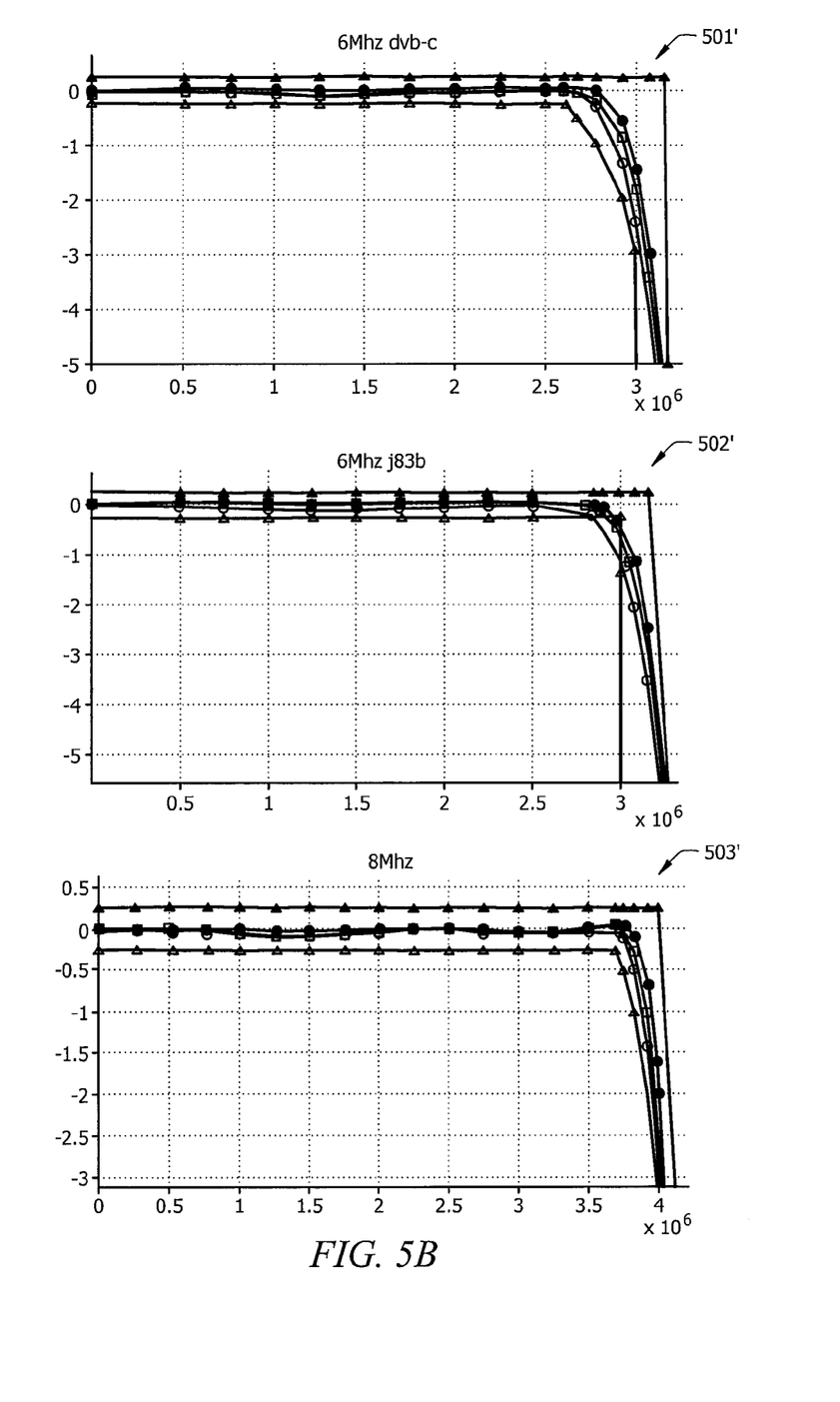

FIGS. 5A-B illustrate example filter response plots in accordance with embodiments of the present invention. These plots show typical external SAW filter masks obtained thru a survey of existing analog SAW filters. Three types of SAW filters (6 Mhz/DVB-C and 8 Mhz) used for three different applications. Plots 501-503 shows a channel filter response utilizing the three SAW filters before implementing coefficient adjustments in response to a shift in clock frequencies of the tuner. Filter response is illustrated for three different sampling frequencies (median, min, max) to illustrate that the new filter response remains within a desired frequency response range. As can be seen, the performance shown in plots 501'-503' exhibits an improved corner frequency response, bandwidth capabilities, etc. over the unadjusted counterparts.

Figure 6:
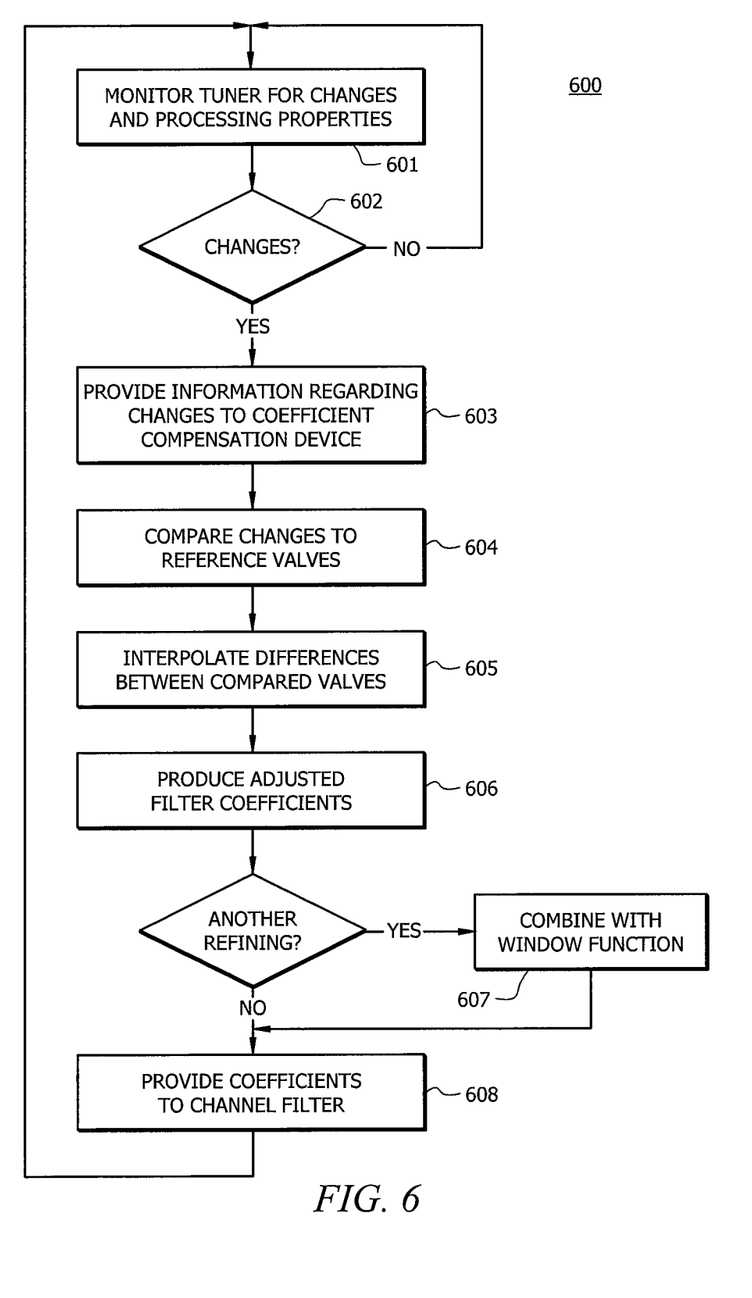
FIG. 6 illustrates a method flowchart in accordance with an embodiment of the present invention.

FIG. 6 illustrates method 600 in accordance with an embodiment of the present invention. Process 601 monitors the tuner device for changes in signal processing properties. As discussed above, these changes may come as a result of the changing of mixing, sampling, and/or clock frequencies of a tuner circuit while utilizing spurious signal avoidance algorithms. If no changes are discovered by process 602, method 600 continues monitoring at 601. In the event that changes are discovered, information regarding the changes is provided to a filter coefficient compensation device by process 603. Process 604 compares discovered changes to reference values and process 605 interpolates the differences to produce adjusted filter coefficients. The adjusted filter coefficients may be further processed by process 606 which combines the coefficients with one or more window functions at block 606. Thereafter, new filter coefficients are provided to a channel filter for the tuner at 607. The new filter coefficients are configured to maintain acceptable frequency response capabilities of the channel filter despite the monitored changes in signal processing properties experienced by the tuner.

Method 600 may be implemented automatically completely by hardware contained on the tuner chip. The automatic implementation functions to calculate the adjusted coefficients without looking up stored coefficients or requiring external user or software access.

As described above, embodiments of the present invention are able to automatically compensate for a large continuous range of clock frequency shifts while not sacrificing bandwidth response characteristics of the channel filter. Further, the present solutions are able to calculate coefficients in order to accomplish this improved response characteristics while utilizing a completely on-chip architecture, which does not require accessing off-chip software driver programs, or require complex look-up tables containing filter coefficients stored in onboard memory.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit comprising:
a filter device configured to receive an input signal and filter said input signal utilizing filter coefficients corresponding to existing processing characteristics of said integrated circuit, said filter device further configured to generate a filtered output signal; and
a filter coefficient calculating device on said integrated circuit, said filter coefficient calculating device configured to automatically calculate new filter coefficients in response to a change in said processing characteristics and to provide said new coefficients to said filter device;
wherein said filter coefficient calculating device further comprises a reference prototype memory configured to store reference filter information and wherein said filter coefficient calculating device further comprises an interpolation device configured to interpolate said changes in processing characteristics with said reference filter information and to output interpolated information corresponding to said new filter coefficients.

2. The integrated circuit of claim 1 wherein said change in processing characteristics is due to changes in said integrated circuit implemented as a result of spurious signal compensation techniques.

3. The integrated circuit of claim 1 wherein said change in processing characteristics is a change in a timing clock signal frequency.

4. The integrated circuit of claim 3 wherein said change in clock signal frequency includes at least one of a change in mixing, sampling, and digital clock frequencies.

5. The integrated circuit of claim 3 wherein said filter coefficient calculating device is configured to calculate new coefficients to compensate for a substantially continuous range of possible clock signal adjustments.

6. The integrated circuit of claim 1 further comprising a mixing device configured to mix a window function with said interpolated information to improve said new filter coefficients.

7. A broadband tuner chip comprising:
a digital processing module configured to produce a channel filtered output, wherein said digital processing module comprises a coefficient calculating module configured to automatically calculate and produce updated filter coefficients for a channel filter in response to changes in processing characteristics of said tuner, wherein said calculating and producing of said filter coefficients is implemented completely on said broadband tuner chip; wherein said coefficient calculating module comprises an interpolator device, said interpolator device configured to interpolate said changes in processing characteristics with a reference value and to output interpolated information which corresponds to said updated filter coefficients.

8. The broadband tuner chip of claim 7 further comprising:
a mixer configured to mix an input signal with an oscillator frequency to produce a mixed signal, wherein said oscillator frequency is configured to change processing characteristics in order to compensate for spurious signals in said channel filtered output which are generated by said oscillator frequency.

9. The broadband tuner chip of claim 7 further comprising:
an analog-to-digital converter configured to receive said mixed signal and to utilize a sampling frequency to convert said mixed signal to a digital signal, wherein said sampling frequency is configured to change processing characteristics in order to compensate for spurious signals in said channel filtered output which are generated by said sampling frequency.

10. The broadband tuner chip of claim 7 wherein said digital processing module is configured to function at a clock frequency, wherein said clock frequency is configured to change processing characteristics in order to compensate for spurious signals in said channel filtered output which are generated by said clock frequency.

11. The broadband tuner chip of claim 7 wherein said coefficient calculating module is configured to calculate and produce filter coefficients in response to a changes in clocking signal properties over a substantially continuous 100 MHz range.

12. A method for automatically compensating for changes in frequency response characteristics of a channel filter on a tuner chip, said method comprising:
monitoring processing functions on said tuner chip for changes in signal processing properties;
providing information regarding monitored changes to a filter coefficient compensation device;
comparing said monitored changes to reference values corresponding to pre-defined processing characteristics;
interpolating differences between said monitored changes and said reference values; and
producing adjusted filter coefficients wherein said adjusted filter coefficients are configured to substantially maintain pre-determined frequency response capabilities of said channel filter.

13. The method of claim 12 wherein said monitored changes include a change in a mixing frequency of said tuner chip.

14. The method of claim 12 wherein said monitored changes include a change in a sampling frequency of said tuner chip.

15. The method of claim 12 wherein said monitored changes include a change in a clock frequency of said tuner chip.

16. The method of claim 12 further comprising combining said adjusted filter coefficients with one or more window functions.

17. The method of claim 12 wherein said window function is a hamming window.

18. The method of claim 12 further comprising providing said adjusted filter coefficients to a channel filter on said tuner chip.

19. The method of claim 12 wherein said comparing and interpolating are implemented on-chip without external assistance.

\* \* \* \* \*